United States Patent
Rotondaro

(10) Patent No.: US 9,269,783 B2
(45) Date of Patent: Feb. 23, 2016

(54) BODY CONTACTED TRANSISTOR WITH REDUCED PARASITIC CAPACITANCE

(75) Inventor: Antonio L. P. Rotondaro, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 703 days.

(21) Appl. No.: 13/420,123

(22) Filed: Mar. 14, 2012

(65) Prior Publication Data

US 2012/0171841 A1 Jul. 5, 2012

Related U.S. Application Data

(62) Division of application No. 12/652,364, filed on Jan. 5, 2010, now Pat. No. 8,441,071.

(51) Int. Cl.
- *H01L 29/423* (2006.01)
- *H01L 29/49* (2006.01)
- *H01L 29/786* (2006.01)

(52) U.S. Cl.
CPC ...... *H01L 29/42384* (2013.01); *H01L 29/4908* (2013.01); *H01L 29/78615* (2013.01)

(58) Field of Classification Search
CPC ............... H01L 29/42384; H01L 29/78615; H01L 29/4908
USPC ........................................................ 438/404
See application file for complete search history.

(56) References Cited

U.S. PATENT DOCUMENTS

| | | | |
|---|---|---|---|
| 5,185,280 A | 2/1993 | Houston et al. | |
| 5,215,931 A | 6/1993 | Houston | |
| 5,707,061 A | 1/1998 | Ikeda et al. | |
| 5,865,435 A | 2/1999 | Ikeda et al. | |
| 6,100,564 A | 8/2000 | Bryant et al. | |
| 6,191,449 B1* | 2/2001 | Shino | 257/347 |
| 6,498,058 B1 | 12/2002 | Bryant et al. | |
| 6,940,130 B2 | 9/2005 | Bryant et al. | |
| 7,300,847 B2 | 11/2007 | Maeda et al. | |
| 7,453,121 B2 | 11/2008 | Cheng et al. | |
| 2002/0175384 A1 | 11/2002 | Ngai et al. | |
| 2003/0190794 A1* | 10/2003 | Ohmi et al. | 438/458 |

FOREIGN PATENT DOCUMENTS

| | | |
|---|---|---|
| CN | 1127149 C | 11/2003 |
| JP | H10-294464 A | 11/1998 |

(Continued)

OTHER PUBLICATIONS

International Search Report/Written Report dated Aug. 19, 2011.

*Primary Examiner* — Laura Menz
*Assistant Examiner* — Candice Y Chan
(74) *Attorney, Agent, or Firm* — Scully, Scott, Murphy & Presser, P.C.; Steven J. Meyers, Esq.

(57) ABSTRACT

A body contacted semiconductor-on-insulator (SOI) metal gate containing transistor that has a reduced parasitic gate capacitance is provided in which a metal portion of a gate stack is removed over the body contact region and a silicon-containing material is formed that contacts the gate dielectric in the body contact region of an SOI substrate. This causes an increase of the effective gate dielectric thickness on the body contact region by greater than 5 angstroms (Å). This results in a lower parasitic capacitance at the body contact region.

18 Claims, 3 Drawing Sheets

(56) References Cited

FOREIGN PATENT DOCUMENTS

| | | | |
|---|---|---|---|
| JP | 2002-134755 | A | 5/2002 |
| JP | 2004-303911 | A | 10/2004 |
| JP | 2006-523008 | A | 10/2006 |
| KR | 1020070003787 | | 5/2007 |

* cited by examiner

BODY CONTACTED TRANSISTOR WITH REDUCED PARASITIC CAPACITANCE

CROSS REFERENCE TO RELATED APPLICATION

This application is a divisional of U.S. patent application Ser. No. 12/652,364, filed Jan. 5, 2010, now U.S. Pat. No. 8,441,071, the entire content and disclosure of which is incorporated herein by reference.

BACKGROUND

The present invention relates to a semiconductor structure and a method of fabricating the same. More particularly, the present invention relates to a body contacted semiconductor-on-insulator (SOI) metal gate-containing transistor that has a reduced parasitic gate capacitance and a method of fabricating the same.

A conventional transistor has a source region and a drain region that are spaced apart by an intervening body region. All of these regions are planar, and the transistor operation is controlled by a gate. The body region is the area from which electron hole pair generation takes place that allows current to be carried between the source region and the drain region underneath a gate. By contacting the body region, a charge may be applied that changes the voltages at which the transistor turns on. This is often referred to as a threshold voltage adjustment because the on voltage of the device is being adjusted with this technique.

Semiconductor-on-insulator (SOI) technology employs a layer of a semiconductor material, typically silicon, overlying an insulation layer on a supporting wafer. Typically, the SOI structure includes a film of crystalline silicon on a buried layer of silicon oxide on a crystalline silicon substrate. SOI technology makes possible certain performance advantages such as, for example, the reduction in parasitic capacitance which is useful in the semiconductor industry.

In a non-SOI transistor, the body is automatically contacted because it forms part of the same semiconductor wafer on which all the devices sit, and is either grounded via contact to the backside of the chip so the bodies of all the devices are grounded, or tied to the power supply via an N-well. In an SOI wafer, however, the body of the transistor is separated from whatever devices may be separately connected to the wafer by the buried insulation layer. SOI technology in which the body is not connected to anything, e.g., a floating body device, may suffer from the problem of hysteresis; the body remains charged and some of the electrical properties from the last time the transistor was used interfere with the subsequent use of the device.

The use of a body contact in SOI technology addresses this problem, and also presents other opportunities. For example, body contacts allow the threshold voltage to be changed so that standby power can be reduced for low-power applications. Body contacts in SOI technology have conventionally be made by creating a T-shaped structure on the diffusion, thereby creating three distinct regions; a source region, a drain region and a body contact region. This approach can lead to decreased performance in that it yields a greatly increased gate capacitance over a conventional semiconductor device, often leading to a very poor performance. Therefore, there exists a need for a body contact in SOI processes that allows precise control of the body potential but that does not lead to the poor performance that comes from high gate capacitance.

One prior art solution to this parasitic capacitance problem of body contacted SOI devices has been to isolate the active and body contact areas of the transistor. Another prior art approach to reduce the parasitic capacitance on the gate of body contacted SOI devices has been the use of a thicker gate oxide under the body region or the implantation of halogen species at the body region.

BRIEF SUMMARY

This invention provides a body contacted semiconductor-on-insulator (SOI) metal gate-containing transistor that has a reduced parasitic gate capacitance. In this invention, the metal portion of a gate stack is removed over a body contact region of an SOI substrate and a silicon-containing material is formed that contacts the gate dielectric in the body contact region of the SOI substrate. This causes an increase of the effective gate dielectric thickness on the body contact region by greater than 5 angstroms (Å). This results in a lower parasitic capacitance at the body contact region. In some embodiments, a greater than 30%, more typically greater than 35%, reduction on parasitic capacitance can be achieved utilizing the method of the present application.

The method used in forming the body contacted SOI metal gate-containing transistor having a reduced parasitic capacitance at the body contact region can be easily integrated into existing metal gate flows. Moreover, the method provides a controllable decrease of the parasitic gate capacitance of the body contacted SOI metal gate-containing transistors.

In one aspect of the invention, a semiconductor structure is provided that includes a body contacted SOI metal gate-containing transistor. The semiconductor structure includes a semiconductor-on-insulator substrate including, from bottom to top, a lower semiconductor layer, a buried insulator layer and an upper semiconductor layer. The upper semiconductor layer of the SOI substrate includes at least one device region and at least one body contact region located therein. A first material stack is present within the at least one device region that includes, from bottom to top, a gate dielectric, a metal gate and a doped silicon-containing layer. A second material stack is present within the at least one body contact region that includes a portion of the gate dielectric of the first material stack located on an upper surface of the upper semiconductor layer and a portion of the doped silicon-containing material of the first material in direct contact with an upper surface of the portion of the gate dielectric that is within the at least one body contact region.

Specifically, a semiconductor structure is provided that includes a semiconductor-on-insulator substrate including, from bottom to top, a lower semiconductor layer, a buried insulator layer and an upper semiconductor layer, the upper semiconductor layer having at least one device region and at least one body contact region located therein. A transistor is located within said at least one device region. The transistor includes, from bottom to top, a gate dielectric, a metal gate and a doped silicon-containing layer. A material stack that does not include a metal gate is located within the at least one body contact region. The material stack includes a portion of the gate dielectric of the transistor located on an upper surface of the upper semiconductor layer, and a portion of the doped silicon-containing material of the transistor in direct contact with an upper surface of the portion of the gate dielectric that is within the at least one body contact region.

In another aspect of the invention, a method of fabricating the above mentioned semiconductor structure is provided. The method includes providing a semiconductor-on-insulator (SOI) substrate including from bottom to top, a lower semiconductor layer, a buried insulator layer and an upper semiconductor layer. The upper semiconductor layer has at least one device region and at least one body contact region located therein. A gate stack is formed within the at least one device region and the at least one body contact region. The gate stack includes, from bottom to top, a gate dielectric and a metal gate. A patterned mask is formed atop the metal gate within that at least on device region, while leaving the metal gate within the at least one body contact region exposed. The exposed metal gate is removed from within the at least one body contact region so as to expose an upper surface of the gate dielectric in the at least one body contact region. A doped silicon-containing material is formed within both the at least one device region and the at least one body contact region, wherein a first portion of the doped silicon-containing material within the at least one device region is atop the metal gate and wherein a second portion of the silicon-containing material within the at least one body contact region directly contacts the exposed surface of the gate dielectric.

DETAILED DESCRIPTION

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Embodiments of the present invention will now be described in greater detail by referring to the following discussion and drawings that accompany the present application.

The drawings of the present application, which are referred to herein below in greater detail, are provided for illustrative purposes and, as such, they are not drawn to scale.

Figure 1:
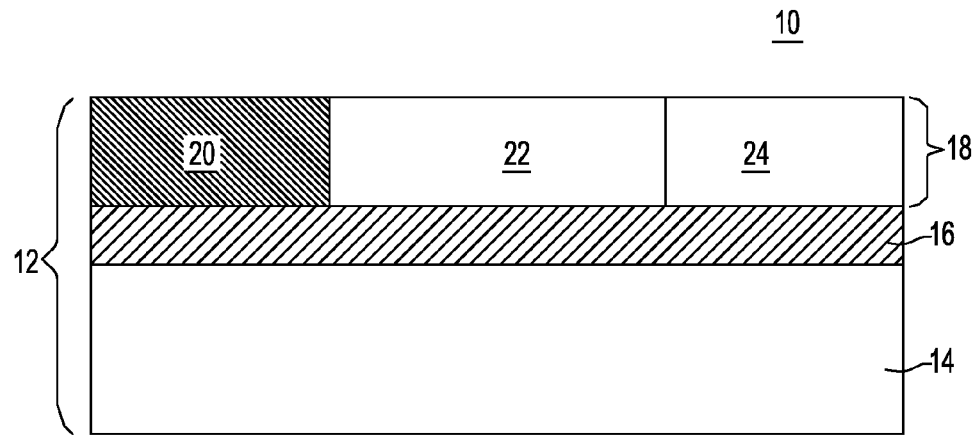
FIG. 1 is a pictorial representation (through a cross sectional view) illustrating an initial structure that can be employed in one embodiment of the invention.

As stated above, the present invention provides a body contacted semiconductor-on-insulator (SOI) metal gate-containing transistor that has a reduced parasitic gate capacitance and a method of fabricating the same. Reference is first made to FIG. 1 which illustrates an initial structure 10 that can be employed in one embodiment of the present application. The initial structure 10 includes a semiconductor-on-insulator (SOI) substrate 12 that has been processed to include at least one isolation region 20 within an upper semiconductor layer 18 of the SOI substrate 12. The upper semiconductor layer 18, which may be referred to as an SOI layer, is located on an upper surface of a buried insulator layer 16. The buried insulator layer 16 is located on an upper surface of a lower semiconductor layer 14, which may also be referred to as a handle substrate. In addition to including at least one trench isolation region 20, the SOI substrate 12 also includes a transistor region 22 and a body contact region 24 within the upper semiconductor layer 18.

The initial structure 10 illustrated in FIG. 1 is comprised of materials that are well known to those skilled in the art. Likewise, the initial structure 10 is fabricated using techniques well known to those skilled in the art. In regard to the SOI substrate 12, the SOI substrate 12 can be formed utilizing a layer transfer process in which a bonding process is used to bond two wafers together wherein at least one of the wafers includes the buried insulator layer. Bonding is achieved by bringing the two wafers into intimate contact with each other, optionally applying an external force and then heating the two contacted wafers under conditions that are capable of bonding the two wafers together. The temperature of the heating step may vary. In one embodiment, the temperature of the heating step is from 200° C. to 1050° C. Other bonding temperatures can also be used as long as the temperatures are capable of bonding two wafers together. In some embodiments of the invention, some materials layers of the bonded wafers can be removed utilizing techniques well known to those skilled in the art.

Another technique that can be used in forming the SOI substrate 12 is an ion implantation process referred to as SIMOX (Separation by ion implantation of oxygen). In such a process, ions are first implanted into a bulk semiconductor wafer to form a damaged region within the wafer. A heating step is utilized to convert the damaged region into a buried dielectric layer. The conditions for such an ion implantation process are well known to those skilled in the art and thus are not provided herein.

The lower semiconductor layer 14 of the SOI substrate 12 comprises a first semiconductor material which can be selected from, but not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Further, the semiconductor material of the lower semiconductor layer 14 can be a single crystalline, i.e., epitaxial, semiconductor material. For example, the lower semiconductor layer 14 can be a single crystalline silicon material. All or portions of the lower semiconductor layer 14 can be doped to provide at least one globally or locally conductive region (not shown) located beneath the interface between the lower semiconductor layer 14 and the buried insulator layer 16. The dopant concentration in doped regions of the lower semiconductor layer 14 can be optimized for device performance. The thickness of the lower semiconductor layer 14 of the SOI substrate 12 may vary and is inconsequential to the present invention. Typically, the thickness of the lower semiconductor layer 14 is from 50 microns to 1 mm.

The buried insulator layer 16 of the SOI substrate 12 is a layer of a dielectric material such as a semiconductor oxide, a semiconductor nitride, a semiconductor oxynitride or mutilayered stacks thereof. In one embodiment of the invention, the buried insulator layer 16 of the SOI substrate 12 is comprised of a buried semiconductor oxide such as, for example, silicon oxide. As illustrated, a lower surface of the buried insulator layer 16 is located on an upper surface of semiconductor layer 14. The buried insulator layer 16 typically has a thickness from 10 nm to 100 nm, with a thickness from 20 nm to 40 nm being more typical. The thickness of the buried insulator layer 16 can be uniform with little or no thickness variation across the substrate. The buried insulator layer 16 can be continuous or it can be patterned.

The upper semiconductor layer 18 of the SOI substrate 12 includes a second semiconductor material, which can be selected from one of the semiconductor materials mentioned above for the lower semiconductor layer 14. In one embodiment, the upper semiconductor layer 18 is comprised of a different semiconductor material than the lower semiconductor layer 14. In yet another embodiment, the upper and lower semiconductor layers are comprised of a same semiconductor material. All or portions of the upper semiconductor material layer 18 can be locally or globally doped with dopants of p-type and/or n-type as needed. As is illustrated, a lower surface of the upper semiconductor material layer 18 is located on an upper surface of the buried insulator layer 16. The thickness of the upper semiconductor material layer 18 can be from 10 nm to 50 nm, although lesser and greater thicknesses can also be employed.

After providing the SOI substrate 12, at least one trench isolation region 20 is formed into the SOI substrate 12 typically through the upper semiconductor layer 18, stopping on an upper surface of the buried insulator layer 16. The at least one trench isolation region 20 can be formed by forming a trench within the SOI substrate 12 utilizing lithography and etching. The trench is then filled with a trench dielectric material. An optional liner can be formed within the trench prior to trench fill and an optional densification step may be performed to densify the trench dielectric material. A planarization process is typically performed to remove trench dielectric material that extends beyond the upper surface of the trench. In some embodiments, the upper surface of the at least one trench isolation region 20 is coplanar with the upper surface of the upper semiconductor layer 18. In yet other embodiments, the upper surface of the at least one trench isolation region 20 can extend somewhat above or somewhat below the upper surface of the upper semiconductor layer 18.

As mentioned above, the upper semiconductor layer 18 includes at least one device region 22 in which at least one transistor can be formed, and at least one body contact region 24. The term "body contact region" is used in the present application to denote the region where the body of the device can be contacted. The at least one device region 22 and the at least one body contact region 24 can be doped as indicated above.

Figure 2:
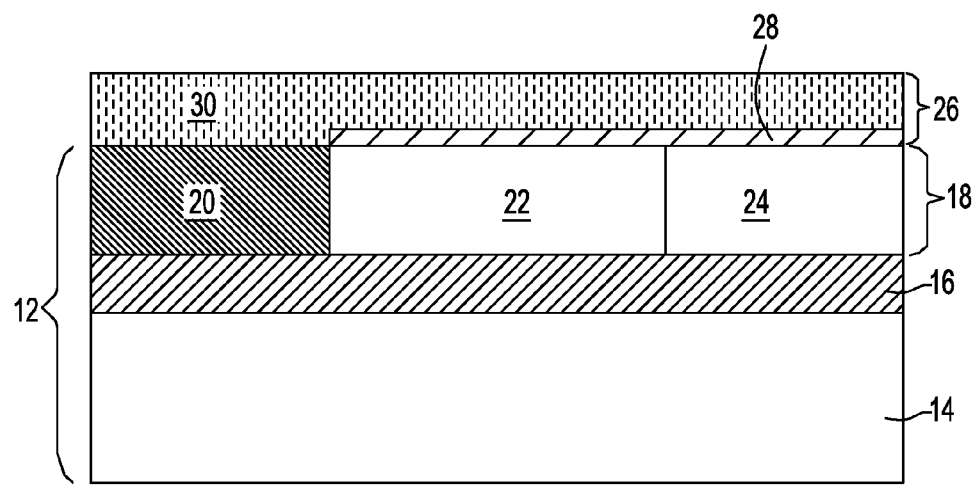
FIG. 2 is a pictorial representation (through a cross sectional view) illustrating the structure of FIG. 1 after forming a gate stack including a gate dielectric and a metal gate on a surface of the initial structure.

Referring now to FIG. 2, there is illustrated the initial structure of FIG. 1 after forming a gate stack 26 on an upper exposed surface thereof. The gate stack 26 includes, from bottom to top, a gate dielectric 28 and a metal gate 30. Other material layers such a threshold voltage adjusting material layer can be present within the gate stack 26 as well.

The gate dielectric 28 of the gate stack 26 comprises any gate insulating material including for example, an oxide, a nitride, an oxynitride or a multilayer stack thereof. In one embodiment of the invention, the gate dielectric 28 is a semiconductor oxide, a semiconductor nitride or a semiconductor oxynitride. In another embodiment of the invention, the gate dielectric 28 includes a dielectric metal oxide having a dielectric constant that is greater than the dielectric constant of silicon oxide, e.g., 3.9. Typically, the gate dielectric 28 that is employed has a dielectric constant greater than 4.0, with a dielectric constant of greater than 8.0 being more typical. Such dielectric materials are referred to herein as a high k dielectric. Exemplary high k dielectrics include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_x$, $N_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the gate dielectric 28. Each value of x is independently from 0.5 to 3 and each value of y is independently from 0 to 2.

The thickness of the gate dielectric 28 may vary depending on the technique used to form the same. Typically, the gate dielectric 28 has a thickness from 1 nm to 20 nm, with a thickness from 2 nm to 10 nm being more typical. When a high k gate dielectric is employed as the gate dielectric 28, the high k gate dielectric can have an effective oxide thickness on the order of, or less than, 1 nm.

The gate dielectric 28 can be formed by methods well known in the art. In one embodiment of the invention, the gate dielectric 28 can be formed by a deposition process such as, for example, chemical vapor deposition (CVD), physical vapor deposition (PVD), molecular beam deposition (MBD), pulsed laser deposition (PLD), liquid source misted chemical deposition (LSMCD), and atomic layer deposition (ALD). Alternatively, the gate dielectric 28 can be formed by a thermal process such as, for example, thermal oxidation and/or thermal nitridation.

Depending on the techniques used in forming the gate dielectric 28, the gate dielectric 28 can extend onto and across an upper surface of the at least one trench isolation region 20 as well being present within regions 22 and 24. Alternatively, and as illustrated in FIG. 2, the gate dielectric 28 is formed only on the upper surface of upper semiconductor layer 18 within regions 22 and 24. The alternative embodiment is typically achieved when a thermal process is used to form the gate dielectric 28.

A metal gate 30 is formed atop the gate dielectric 28 and optionally atop the trench dielectric of the at least one trench isolation region 20 when no gate dielectric is present on the upper surface of the trench isolation region. The metal gate 30 includes an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the metal gate is composed of an elemental metal.

The metal gate 30 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When a metal silicide is formed, a conventional silicidation process is employed. The as deposited metal gate 30 typically has a thickness from 10 nm to 100 nm, with a thickness from 20 nm to 50 nm being even more typical.

Figure 3:
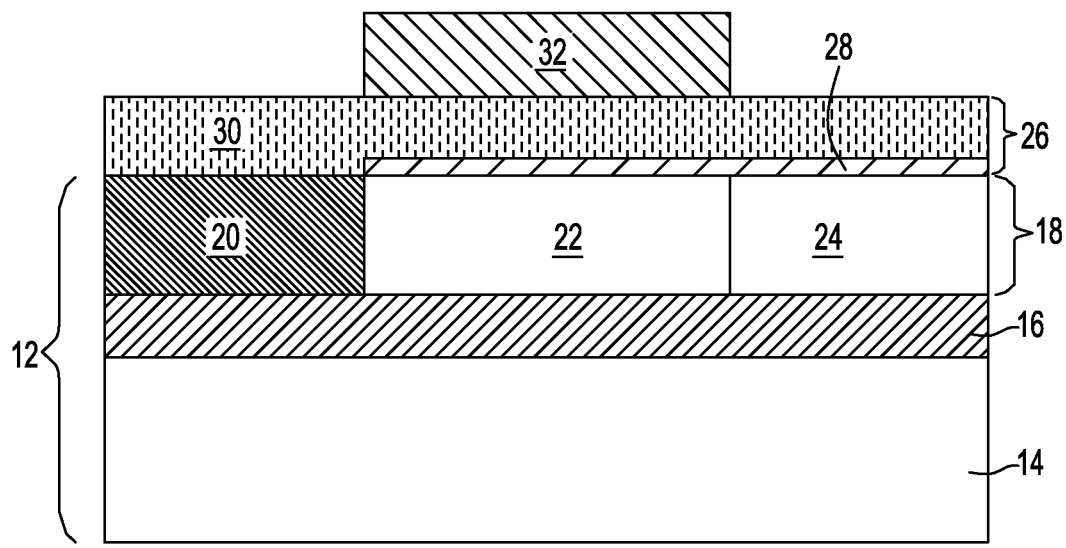
FIG. 3 is a pictorial representation (through a cross sectional view) illustrating the structure of FIG. 2 after forming a patterned mask on a portion of the gate stack.

Referring now to FIG. 3, there is illustrated the structure of FIG. 2 after forming a patterned mask 32 on a portion of the gate stack 26 that is located within the at least one device region 22. The patterned mask 32 protects the gate stack 26 within the at least one device region 22, while leaving the gate stack 26 above the at least one trench isolation region 20 and within the at least one body contact region 24 exposed. The patterned mask 32 can be comprised of a hard mask, a photoresist or a combination thereof. In embodiments in which the patterned mask 32 is comprised of a hard mask, the hard mask may include any conventional hard mask material including, but not limited to silicon oxide and/or silicon nitride. When the patterned mask 32 is comprised of a photoresist, any conventional photoresist material that can serve as block mask can be employed in the present invention. In some embodiments, it is preferred to use a hard mask as a mask material.

The patterned mask 32 can be formed by techniques that are well known to those skilled in the art. In one embodiment, the patterned mask 32 can be formed by blanket deposition of a layer of a mask material across the upper surface of the metal gate 30. Deposition of the layer of mask material includes any known deposition process such as, for example, chemical vapor deposition (CVD), plasma enhanced chemical vapor deposition (PECVD), atomic layer deposition (ALD), physical vapor deposition (PVD), chemical solution deposition and spin-on coating. In some embodiments, a thermal growing technique such as oxidation and/or nitridation can be used in forming the blanket layer of mask material.

Following deposition, the blanket layer of mask material is patterned into patterned mask 32. The patterning can include lithography alone or a combined lithography and etching process. Lithography alone is typically employed when the patterned mask 32 is comprised only of a photoresist material. When the patterned mask 32 includes a hard mask material, combined lithography and etching is typically employed. The term "lithography" is used herein to denote a process of exposing a photoresist material to a desired pattern of radiation and then developing the exposed resist material. The etching step used in patterning the blanket layer of the first block mask material includes dry etching, wet etching or a combination of dry etching and wet etching. Dry etching includes one of reactive ion etching (RIE), plasma etching, ion beam etching, and laser ablation. Wet etching includes the use of a chemical etchant.

The thickness of the patterned mask 32 can vary depending on the type of mask material employed, the number of layers within the patterned mask 32, and the deposition technique that is employed in forming the same. Typically, the patterned mask 32 has a thickness from 3 nm to 300 nm, with a thickness from 10 nm to 150 nm being more typical.

Figure 4:
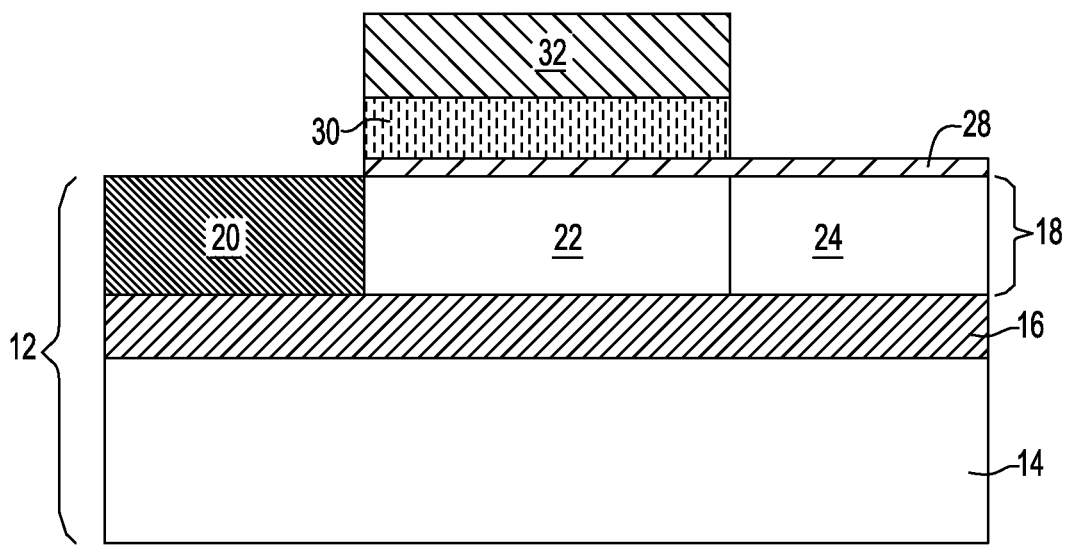
FIG. 4 is a pictorial representation (through a cross sectional view) illustrating the structure of FIG. 3 after removing exposed portions of the metal gate not protected by the patterned mask.

Referring now to FIG. 4, there is illustrated the structure of FIG. 3 after removing portions of the metal gate 30 not protected by the patterned mask 32. That is, FIG. 4 illustrates the structure after the metal gate 30 has been removed from atop the at least one trench isolation region 20 and atop the gate dielectric 28 within the at least one body contact region 24, while maintaining the metal gate 30 within the at least one device region 22. The removal of the exposed portions of the metal gate 30 is performed utilizing a conventional etching process including dry etching and/or wet etching. The patterned mask 32 serves as an etch mask. When dry etching is employed in removing the exposed portions of the metal gate 30, the dry etch includes reactive ion etching, plasma etching, ion beam etching, or laser ablation. When wet etching is employed a chemical etchant is employed. The etching process removes the exposed portion of the metal gate 30 selective to the patterned mask 32, the underlying gate dielectric 28, and optionally the underlying trench isolation region 20.

The patterned mask 32 is typically, but not necessarily always, removed from the structure after the exposed metal gate 30 has been selectively removed. The removal of the patterned mask 32 can be performed utilizing a conventional process such as, but not limited to, resist stripping, wet etching, chemical mechanical polishing (CMP), grinding or a combination of CMP and grinding. In some embodiments, the patterned mask 32 can remain within the structure.

Figure 5:
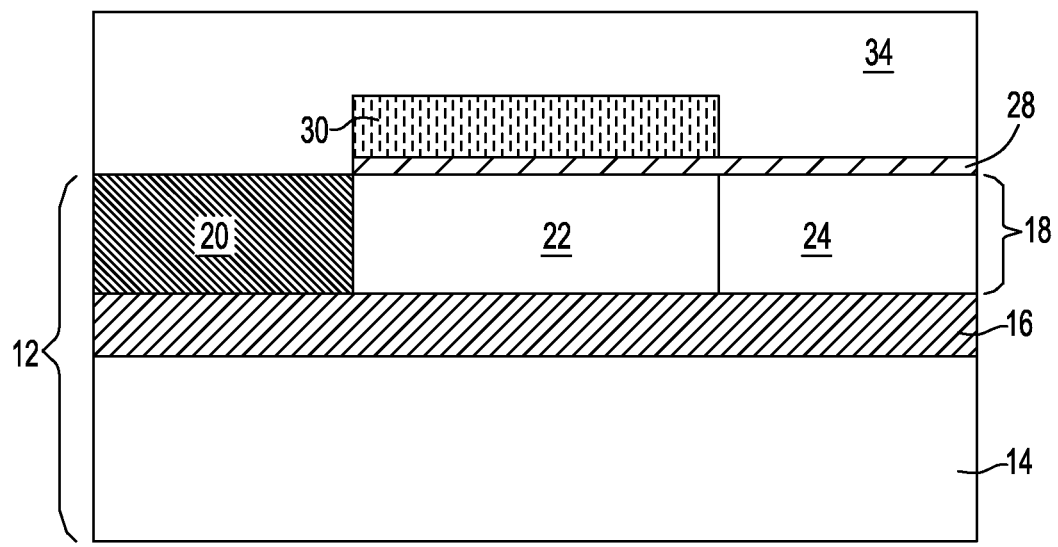
FIG. 5 is a pictorial presentation (through a cross sectional view) illustrating the structure of FIG. 4 after forming a silicon-containing material thereon.

Referring to FIG. 5, there is illustrated the structure of FIG. 4 after removing the patterned mask 32 and forming a Si-containing material 34 that is conductive on all exposed surfaces. The patterned mask 32 is removed as described above. The silicon containing material 34 that is formed can include an amorphous or polycrystalline material that includes silicon which is doped. Examples of silicon-containing materials that can be used in the present invention include Si and/or SiGe. The silicon-containing material 34 can be doped in-situ during the deposition of the material or ex-situ after deposition utilizing, for example, ion implantation or gas phase doping. Notwithstanding when the doping of the silicon-containing material 34 occurs, the deposition of the silicon-containing material 34 can include, but it not limited to, CVD, PECVD, evaporation, chemical solution deposition, and PVD.

It is noted that the method of the present invention provides a T-shaped gate if view from a top-down view.

Although not described and illustrated, the method described above can also include further FET processing steps including, but not limited to, extension region formation, spacer formation around the FET gate stack, source/drain region formation, and formation of metal semiconductor alloy contacts atop at least each of the source/drain regions. In some embodiments of the invention, metal semiconductor alloy contacts can be formed atop the gate stack within the at least one device region. These FET processing steps typically, but not necessarily always, occur after the structure shown in FIG. 5 is formed.

The extension regions are formed utilizing any known extension ion implantation process. After the extension ion implantation, an anneal can be used to activate the implanted extension ions. The spacer is formed utilizing any known process including deposition of a spacer material, followed by etching. Typical spacer materials include an oxide and/or a nitride. After formation of the spacer, source/drain regions are formed into an upper exposed surface of the substrate at the footprint of each of the patterned gate stacks. The source/drain regions are formed utilizing a source/drain ion implantation process followed by annealing. The metal semiconductor alloy contacts are formed utilizing any process that is capable of forming a metal semiconductor alloy atop a semiconductor material. In one embodiment of the invention, the metal semiconductor alloy contacts are formed utilizing a silicide process. The silicide process can be self-aligned to the outer edge of the spacer. The silicide process includes forming a metal capable of forming a metal semiconductor alloy when reacted with a semiconductor material. The metal used in forming the metal semiconductor alloy contact can include, but is not limited to tantalum, titanium, tungsten, ruthenium, cobalt, nickel, platinum, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
    providing a semiconductor-on-insulator (SOI) substrate including a semiconductor layer having at least one device region and at least one body contact region located therein;
    forming a gate stack within said at least one device region and said at least one body contact region, wherein said gate stack includes, from bottom to top, a gate dielectric and a metal gate;
    forming a patterned mask atop the metal gate within that at least one device region, while leaving the metal gate within that at least one body contact region exposed;
    removing the exposed metal gate from within the at least one body contact region so as to expose an upper surface of said gate dielectric; and
    forming a doped silicon-containing material within both the at least one device region and said at least one body contact region, wherein a first portion of said doped silicon-containing material within the at least one device region is located directly on, and covers an entirety of, an upper surface of the metal gate and wherein a second portion of said doped silicon-containing material within the at least one body contact region directly contacts the exposed surface of said gate dielectric, and wherein said doped silicon-containing material is located directly on vertical sidewalls of said metal gate in said at least one device region.

2. The method of claim 1 wherein said providing the SOT substrate includes a layer transfer process, said layer transfer process comprising bonding two wafers together, wherein at least one of the wafers includes an insulator layer.

3. The method of claim 1 wherein said providing the SOI substrate includes an ion implantation process.

4. The method of claim 1 wherein said providing the SOI substrate further includes forming at least one trench isolation region within said semiconductor layer.

5. The method of claim 4 wherein a bottommost surface of said at least one trench isolation region contacts an uppermost surface of the buried insulator layer of said SOI substrate.

6. The method of claim 1 wherein said patterned mask is formed by deposition of a mask material, and lithography.

7. The method of claim 6 further comprising an etch step following lithography.

8. The method of claim 1 wherein said removing the exposed metal gate comprises an etching process that removes the metal gate selective to the patterned mask and underlying dielectric or insulating materials.

9. The method of claim 8 wherein said etching process includes dry etching, wet etching or a combination thereof.

10. The method of claim 1 wherein said doped silicon-containing material is formed by an in-situ doping deposition process.

11. The method of claim 1 wherein said doped-silicon-containing material is formed by deposition followed by doping.

12. The method of claim 1 further comprising removing the patterned mask after removing the exposed metal gate and prior to forming the doped silicon-containing material.

13. The method of claim 12 wherein said providing the SOI substrate includes doping the semiconductor layer within the at least one device region and the at least one body contact region.

14. The method of claim 1 wherein said gate dielectric extends onto an uppermost surface of a trench isolation region that is located laterally adjacent said at least one device region.

15. The method of claim 1 wherein said at least one device region has an uppermost surface that is coplanar with an uppermost surface of the body contact region.

16. A method of fabricating a semiconductor structure comprising:
    providing a semiconductor-on-insulator (SOI) substrate including a semiconductor layer having at least one device region and at least one body contact region located therein;
    forming a trench isolation region laterally adjacent from said at least one device region, said trench isolation region having a bottommost surface that is in direct contact with an uppermost surface of a buried dielectric material of the SOI substrate;
    forming a gate stack within said at least one device region and said at least one body contact region, wherein said gate stack includes, from bottom to top, a gate dielectric and a metal gate;
    forming a patterned mask atop the metal gate within that at least one device region, while leaving the metal gate within that at least one body contact region exposed;
    removing the exposed metal gate from within the at least one body contact region so as to expose an upper surface of said gate dielectric; and
    forming a doped silicon-containing material within both the at least one device region and said at least one body contact region, wherein a first portion of said doped silicon-containing material within the at least one device region is located directly on, and covers an entirety of, an upper surface of the metal gate and wherein a second portion of said doped silicon-containing material within the at least one body contact region directly contacts the exposed surface of said gate dielectric, and wherein said doped silicon-containing material is located directly on vertical sidewalls of said metal gate in said at least one device region.

17. The method of claim 16 further comprising removing the patterned mask after removing the exposed metal gate and prior to forming the doped silicon-containing material.

18. The method of claim 16 wherein said at least one device region has an uppermost surface that is coplanar with an uppermost surface of body contact region and an uppermost surface of the trench isolation region.

* * * * *